United States Patent [19]
Ali et al.

[11] Patent Number: 5,437,932
[45] Date of Patent: Aug. 1, 1995

[54] HIGH SPEED AQUEOUS SOLVENT DEVELOPABLE PHOTOPOLYMER COMPOSITIONS

[75] Inventors: M. Zaki Ali; Mahfuza B. Ali, both of Woodbury; Dean M. Moren, North St. Paul, all of Minn.

[73] Assignee: Minnesota Mining and Manufacturing Company, St. Paul, Minn.

[21] Appl. No.: 242,367

[22] Filed: May 13, 1994

Related U.S. Application Data

[62] Division of Ser. No. 52,117, Apr. 23, 1993, abandoned, which is a division of Ser. No. 658,983, Feb. 21, 1991, Pat. No. 5,235,015.

[51] Int. Cl.$^6$ .................... C08F 20/64; B32B 15/08
[52] U.S. Cl. .................... 428/461; 428/462; 430/281; 430/284; 430/286; 522/14; 522/15; 522/34; 522/121; 522/149; 526/288; 526/292.2; 526/304; 526/306
[58] Field of Search .................... 430/281, 286, 284; 522/14, 15, 34, 121, 149; 526/288, 292.2, 304, 306; 428/461, 462

[56] References Cited

U.S. PATENT DOCUMENTS

| | | |
|---|---|---|
| 3,448,089 | 6/1969 | Celeste .................... 260/78.5 |
| 3,583,950 | 6/1971 | Kollinsky et al. .................... 260/78 |
| 3,598,790 | 8/1971 | Kollinsky et al. .................... 260/78.3 |
| 4,111,922 | 9/1978 | Beede et al. .................... 526/292 |
| 4,199,362 | 4/1980 | Yoshida et al. .................... 430/218 |
| 4,288,523 | 9/1981 | Taylor .................... 430/215 |
| 4,304,705 | 12/1981 | Heilmann et al. .................... 260/30.4 N |
| 4,304,923 | 12/1981 | Rousseau .................... 560/26 |
| 4,378,411 | 3/1983 | Heilmann et al. .................... 428/500 |
| 4,451,619 | 5/1984 | Heilmann et al. .................... 525/379 |
| 4,547,449 | 10/1985 | Alexandrovich et al. .................... 430/115 |
| 4,737,560 | 3/1984 | Wolf .................... 198/457 |
| 4,902,569 | 2/1990 | Chen .................... 526/304 |
| 4,914,165 | 4/1990 | Klun et al. .................... 525/528 |
| 4,996,243 | 2/1991 | Rasmussen et al. .................... 526/306 |

*Primary Examiner*—Mark A. Chapman
*Attorney, Agent, or Firm*—Gary L. Griswold; Walter N. Kirn; Carolyn V. Peters

[57] ABSTRACT

Novel photosensitive compositions based on azlactone derived polymers are described. The polymers have a hydroearbyl backbone and pendant peptide groups with free-radically polymerizable functionality attached thereto, said polymer further comprising at least one oxyacid group or salt thereof, and optionally quaternary ammonium salt groups. A high speed durable printing plate having a mild pH aqueous developability is disclosed which incorporates these polymers in combination with a photoinitiator. The polymers are also useful as proofing films in graphic arts applications.

4 Claims, No Drawings

HIGH SPEED AQUEOUS SOLVENT DEVELOPABLE PHOTOPOLYMER COMPOSITIONS

This is a division of application Ser. No. 08/052,117, filed Apr. 23, 1993, now abandoned which is a division of application Ser. No. 07/658,983, filed Feb. 21, 1991, now U.S. Pat. No. 5,235,015.

BACKGROUND OF THE INVENTION

1. Field of the Invention

This invention relates to photosensitive polymer-containing compositions having aqueous developability, high durability, and good adhesion to treated aluminum substrates. These polymers are useful in imaging systems used in the graphic arts, particularly as photoresists or printing plates.

2. Background of the Invention

Imaging systems employing free-radical polymerization to crosslink an energy sensitive composition are well known in the graphic arts and provide, for example, printing plates. In order to attain maximum sensitivity, and therefore a higher rate of plate production, it is generally necessary to prevent oxygen from inhibiting the polymerization process. This is generally accomplished by the use of a barrier layer topcoat of a material such as polyvinyl alcohol which is relatively impervious to oxygen, the use of an inert or very low pressure atmospheric environment, or the addition of an oxygen scavenger to the energy sensitive composition.

U.S. Pat. No. 4,304,923 discloses printing plate compositions with branched condensation urethane oligomers having both ethylenically unsaturated free-radically polymerizable groups and carboxylic acid groups.

U.S. Pat. No. 3,448,089 describes copolymers suitable for coatings and printing plates containing a plurality of pendant acrylic ester groups and carboxylic acid groups but they cannot contain peptide groups.

U.S. Pat. Nos. 3,583,950 and 3,598,790 describe copolymers of vinyl azlactones and ethylenically unsaturated monomers. There are no free-radically polymerizable groups in the copolymer.

U.S. Pat. Nos. 4,378,411 and 4,304,705 disclose radiation curable polymers derived from a copolymer of vinyl azlactone having pendant ethylenically unsaturated groups. The polymer does not contain either acid salt groups or quaternary ammonium salt groups attached to it.

U.S. Pat. No. 4,737,560 describes polymer beads derived from polymerization of i) a vinyl azlactone monomer, ii) a water soluble monomer (including acid salt containing monomers), and iii) a cross-linking agent (i.e., a multifunctional free-radically polymerizable monomer). Similarly, U.S. Pat. No. 4,111,922 discloses cross-linked hydrophilic random copolymers derived from quaternary ammonium monomers and ethylenically unsaturated monomers which have improved water absorbancy and bacteriostatic properties. In both cases the polymer is an insoluble, uncoatable, cross-linked material and is unsuitable for use in photopolymer imaging.

U.S. Pat. No. 4,451,619 describes a method for modifying the hydrophilicity of alkenyl azlactone derived polymers. The polymers described are not capable of free-radical polymerization crosslinking reactions in that they do not have pendant ethylenically unsaturated groups.

U.S. Pat. No. 4,288,523 describes polymers with pendant acid and peptide groups. In this case the polymer contains no free-radically polymerizable groups.

U.S. Pat. No. 4,914,165 discloses aqueous solvent dispersible, radiation cross-linkable compounds and oligomers containing a polyether backbone and multiple ethylenically unsaturated groups in combination with carboxyl groups. The compounds and oligomers are useful in the graphic arts.

U.S. Pat. No. 4,547,449 discloses liquid electrographic developers which contain an addition copolymer of a quaternary ammonium salt monomer, an acid monomer, and a solubilizing monomer. U.S. Pat. No. 4,199,362 discloses polymer latex compounds derived from copolymerization of acid containing monomers and ethylenically unsaturated monomers. These compositions do not have free-radically polymerizable pendant groups.

SUMMARY OF THE INVENTION

Briefly, this invention provides novel energy sensitive polymers having a linear hydrocarbyl backbone and pendant peptide groups with free-radically polymerizable functionality attached thereto, and additionally at least one organic oxyacid group or salt thereof. These functionalities impart aqueous solubility and adhesion to treated substrates. Optionally, quaternary ammonium salt groups can be present.

In another aspect this invention provides photosensitive compositions coated on substrates suitable for use as printing plates and proofing films. The printing plates have long press life, desirable speed, and exhibit insensitivity to oxygen.

Adhesion of the energy sensitive composition to an appropriate substrate is also an important consideration in the performance of any imaging system, and particularly in the case of printing plates where durability in actual use (i.e., press life) is extremely important. In addition, it is desirable that the energy sensitive compositions be developable with substantially aqueous solvents of mild pH to reduce disposal problems of the spent developer. This invention provides an environmentally acceptable developer in contrast to certain prior known systems which require either highly caustic or acidic developers. In addition, the polymers of the present invention can provide durable and non-tacky coatings without use of a binder. The polymers of the invention have number average molecular weights in the range of 2,000 to 1,000,000, preferably 20,000 to 1,000,000, and more preferably 50,000 to 200,000.

In this application:

"peptide group" means the group

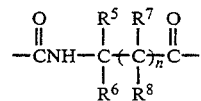

wherein $R^5$, $R^6$, $R^7$, $R^8$ and n are as defined below;

"substantially aqueous" means at least 90 percent by weight water, and

"alkenyl azlactone" means 2-oxazolin-5-one groups of Formula I and 2-oxazin-6-one groups of Formula II:

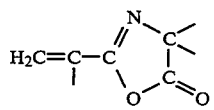

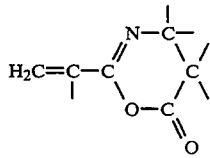

DETAILED DESCRIPTION OF PREFERRED EMBODIMENTS OF THE INVENTION

The energy sensitive polymers of the instant invention which may be block or random, preferably random, and which have homo- or copolymeric backbones, are described by formula III:

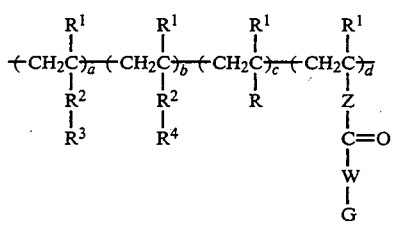

wherein $R^1$ can be hydrogen or methyl;

$R^2$ can be given by

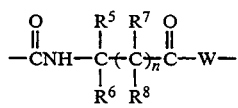

wherein n is 0 or 1; $R^5$, $R^6$, $R^7$, and $R^8$ can be independently an alkyl group having 1 to 12 carbon atoms or a cycloalkyl group having 5 to 12 carbon atoms, an aryl or aralkyl group having 6 to 12 carbon atoms or at least one of the pairs $R^5$ and $R^6$, and $R^7$ and $R^8$, taken together with the carbon to which it is joined forms a 5- or 6-membered carbocyclic ring, or any of $R^5$, $R^6$, $R^7$ and $R^8$ may be H when n is 1; preferably $R^5$ and $R^6$ are methyl and n is 0;

W can be —NH—, $NR^{20}$, —S— or —O—, wherein $R^{2^\circ}$ can be alkyl of 1 to 12 carbon atoms; preferably W can be —O— or —NH—; it is most preferred that W is —O—;

Z can represent

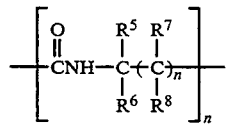

wherein $R^5$, $R^6$, $R^7$, $R^8$, and n are as previously described;

$R^3$ can be a polymerizable, ethylenically unsaturated group selected from (a)

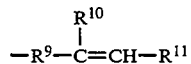

in which $R^9$ can be an alkylene group having 1 to 12 carbon atoms, an arylene group having 6 to 10 carbon atoms, an oxyalkylene group or a poly(oxyalkylene) in which the alkylene group has 2 to 4 carbon atoms and the number of oxygen atoms is a positive integer less than or equal to four, most preferably $R^9$ has from 1 to 4 carbon atoms; $R^{10}$ is hydrogen, cyano, a carboxyl group, or a —C(=O)NH$_2$ group; and $R^{11}$ is hydrogen, an alkyl group having 1 to 12 carbon atoms, or a phenyl group or naphthyl group optionally having substitution thereon which can be, for example, halogen, an alkyl or alkoxy group from 1 to 4 carbon atoms, or (b) —$R^9$—W—T in which $R^9$ is as defined as in (a), W is as previously defined, and T is an ethylenically unsaturated group selected from the group consisting of acryloyl, methacryloyl, cinnamoyl, maleoyl, fumaroyl, itaconoyl, and crotonoyl, and is preferably acryloyl or methacryloyl;

a, b, c, and d independently are integers, wherein a and b are at least 1, and the sum of a+b+c+d is sufficient to provide a polymer having a number average molecular weight in the range of 2,000 to 1,000,000;

G is given by —$R^9$—N$^+$$R^{12}$$R^{13}$$R^{14}$X$^-$, wherein $R^9$ is as previously defined and wherein $R^{12}$, $R^{13}$, and $R^{14}$ are independently an alkyl group having 1 to 12 carbon atoms or a cycloalkyl group having 5 to 12 carbon atoms, an aryl or aralkyl group having 6 to 12 carbon atoms or any two or all three of $R^{12}$, $R^{13}$, and $R^{14}$ taken together with the nitrogen to which they are joined can form a 5- to 8-membered heterocyclic ring, and X$^-$ represents any non-interfering action including anions located elsewhere on the polymeric backbone or side chains. Examples of non-interfering anions are well known in the imaging art and include, but are not limited to anions with a unitary negative charge such as chloride, bromide, iodide, alkyl and aryl carboxylates, alkyl and aryl sulfonates, bicarbonate, etc., and anions with a negative charge greater than 1 such as sulfate, phosphate, and the like. Preferred anions are iodide, chloride, and bromide.

R represents an aryl group having from 6 to 30 carbon atoms, cyano, —CO$_2$H, carboalkoxy group having from 2 to 40 carbon atoms, or a mono- or dialkylamido group having from 2 to 40 carbon atoms. Preferably R is —CO$_2$H.

$R^4$ represents hydrogen, or a solubilizing cation such as sodium, potassium, or quaternary ammonium, or —E—A wherein E represents a divalent organic connecting group having up to a total of about 18 C, N, S, and nonperoxidic O atoms, and A is an acid group selected from carboxyl, sulfo, and phospho groups, and salts thereof. $R^4$ may be multifunctional, having more than one group A. Non-limiting examples of E include alkylene and arylene groups (e.g., propane-1,3-diyl, methylene, dodecane-1,12-diyl, p-phenylene), oxa-substituted alkylene groups (e.g., 2-oxapropan-1,3-diyl, 3-oxapentan-1,5-diyl), aza-substituted alkylene groups (e.g., 2-azapropan-1,3-diyl, 3-methyl-3-azapentan-1,5)diyl) and the like. Examples of A include, but are not limited to, carboxy group (—COOH), phospho group (—PO$_3$H$_2$), and sulfo group (—SO$_3$H) and their salts with alkali metals (e.g., sodium, lithium, potassium), mono-, di-, tri-, and tetra-substituted ammonium salts (e.g., ammonium, tetrabutyl ammonium, phenyldipropylammonium). Preferably, A is a carboxyl group, sulfo group, or phospho group or an alkali metal or tetra substituted ammonium salt thereof.

The polymers of the invention are conveniently prepared by free-radically polymerizing an alkenyl azlactone monomer, optionally in the presence of additional free radically polymerizable comonomers, to give a polymer which is subsequently derivatized with functional free-radically polymerizable groups. It is preferred to use 10 to 100 weight percent alkenyl azlactone monomer and 0 to 90 weight percent comonomer, more preferably 50 to 100 weight percent alkenyl azlactone and 50 to 0 weight percent comonomer. This procedure avoids the problem of polymerization of the pendant free-radically polymerizable group during synthesis of the polymer backbone. Vinyldimethylazlactone is commercialy available.

2-Alkenylazlactones are well-known and their synthesis, physical and chemical properties, homo- and copolymerization behavior, and preparations and applications are discussed in a recent review by J. K. Rasmussen et al., "Polyazlactones" which is contained in the *Encyclopedia of Polymer Science and Engineering*, Volume 11, 2nd edition (1988) pp. 558–571. Useful 2-alkenyl azlactones for the present invention include 2-vinyl-4,4-dimethyl-2-oxazolin-5-one, 2-isopropenyl-4,4-dimethyl-2-oxazolin-5-one, 2-vinyl-4-ethyl-4-methyl-2-oxazolin-5-one, 2-vinyl-4,4-diethyl-2-oxazolin-5one, 2-vinyl-4-methyl-4-phenyl-2-oxazolin-5-one, 2-isopropenyl-4,4-tetmmethylene-2-oxazolin-5-one, 2-vinyl-4,4-pentamethylene-2-oxazolin-5-one, and 2-vinyl-4,4-dimethyl-2-oxazin-6-one.

Representative comonomers include acrylic acid and methacrylic acid, and monofunctional acrylates and methacrylates, acrylamides and methacrylamides, acrylonitrile and methacrylonitrile, styrene, and N-vinylpyrrolidone. Preferred comonomers include dimethylaminoethyl methacrylate and acrylate, methyl methacrylate, ethyl acrylate, ethylene oxide acrylate, itaconic acid, isooctyl methacrylate, lauryl methacrylate, or salts thereof, preferably quaternary ammonium salts having 4 to 25 carbon atoms, more preferably having 10 to 25 carbon atoms. Examples of preferred quaternary ammonium cations include, but are not limited to, ethyl trimethyl ammonium, tetrabutyl ammonium, hexyltributyl ammonium, tetrahexyl ammonium, methyl tribenzyl ammonium, benzyl trimethyl ammonium, and the like. The anion can be any solubilizing anion.

Polymerization of the polymer backbone to provide a homopolymer or a copolymer may be accomplished by either thermal (for example through the decomposition of acyl peroxides, dialkyl percarbonates, azoalkanes, etc.) or photochemical (such as photolysis of bisimidazoles, benzoin ethers, aromatic ketones, halomethyl-s-triazines, sensitized iodonium or sulfonium salts, etc.) means well known in the art. Thermal initiation is preferred. Amounts of initiator can be in the range of 0.01 to 10 weight percent of the total composition.

While the polymers of the instant invention can have a linear hydrocarbyl backbone and pendant peptide groups with free radically polymerizable functionality attached thereto, and additionally organooxy acid residue groups, it is generally preferred that additional quaternary ammonium groups are present, as mentioned above. In many instances increases in adhesion to metals such as treated aluminum substrates is observed upon inclusion of these groups in the polymer. The quaternary ammonium salt groups may be incorporated into the polymer either by copolymerization of a quaternary ammonium salt containing monomer, or by reaction with the formed polymer via a coupling reaction (such as coupling through an azlactone group with a nucleophile substituted quaternary ammonium salt), or by quaternization of a tertiary amine bound to the polymer.

The radiation crosslinkable compositions of the invention are prepared by dissolving the free-radically polymerizable compounds, i.e., those of formula III, in a suitable solvent to a concentration of about 1 to 20%, preferably about 5 to 10% by weight. When the formula III polymers have been prepared in a solvent, it may be necessary only to add additional solvent to reach the desired concentration. Examples of solvents that can be used include acetone, methyl ethyl ketone, methanol, ethanol, n-propanol, isopropanol, ethyl acetate, benzene, toluene, trichloroethylene and the like. Preferred solvents are the aqueous alcohols.

The coating weight of the composition of the present invention is usually 0.3 to 9 $g/m^2$, preferably 0.5 to 5 $g/m^2$, and most preferably 0.8 to 2.4 $g/m^2$. Suitable substrates include resin coated paper, various transparent or opaque plastic sheets or films, metal sheets and foils (preferably aluminum substrates that have been grained and anodized). The coated substrates are maintained in the absence of light unless the element is sensitized to a narrow range of the electromagnetic spectrum outside the range of normal light and the element is provided with a filter layer which excludes normal visible light.

The polymers of the instant invention are normally coated by means known in the art onto a substrate for use in various imaging applications. Substrates may be transparent or opaque. Suitable substrates on which the compositions of the instant invention may be supported include, but are not limited to, metals (for example, steel and aluminum plates including aluminum treated with hydrophilizing agents such as silicates or polyacrylic acid and its derivatives, sheets, and foils); films or plates composed of various film-forming synthetic or high polymers including addition polymers (e.g., poly(vinylidene chloride), poly(vinyl chloride), poly(vinyl acetate), polystyrene, polyisobutylene polymers and copolymers), and linear condensation polymers (e.g., poly(ethylene terephthalate), poly(hexamethylene adipate), poly(hexamethylene adipamide/adipate)). Aluminum is a preferred substrate. Silicated aluminum is particularly preferred.

The imageable layers of the instant invention may contain various materials in combination with the essential ingredients of the instant invention. For example, pigments, dyes, plasticizers, coating aids, antioxidants (e.g., ascorbic acid, hindered phenols, phenidone, etc.) in amounts sufficient to prevent premature cross-linking but insufficient to prevent crosslinking of the energy sensitive polymers upon addition of energy, surfactants, antistatic agents, waxes, ultraviolet radiation absorbers, mild oxidizing agents, and brighteners may be used without adversely affecting the practice of the invention. These adjuvants can be added in amounts in the range 0.01 to 5.0 percent by weight of the coating composition (100% solids).

The radiation crosslinkable compositions of the instant invention may be crosslinked by exposing the compositions containing a photoinitiator to actinic radiation or electron beam. The photoinitiator may be either a single compound which generates radicals on exposure to radiation or a combination of two or more components. Initiation may be direct or sensitized. Preferred photoinitiators are sensitized or unsensitized halomethyltriazines (described, for example, in U.S. Pat. No. 3,775,113) and sensitized diaryliodonium salts (described, for example, in U.S. Pat. Nos. 3,729,313, 4,058,400, 4,058,401, and 4,921,827), hereby incorporated herein by reference. Suitable sensitizers for the preferred photoinitiators are described in the foregoing references. Effective amounts of initiators are disclosed in the referenced patents.

The preferred diaryliodonium salts useful as photoinitiators in practice of the instant invention may be generally described by the formulae given in U.S. Pat. No. 4,460,154, that is

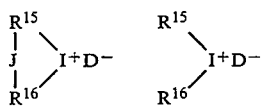

wherein $R^{15}$ and $R^{16}$ can be individually selected from aromatic groups having from 4 to 20 carbon atoms (e.g., substituted or unsubstituted phenyl, naphthyl, thienyl, and furanyl) with substantially any substitution which does not interfere with the desired reaction, J is selected from a carbon-carbon bond, oxygen, sulfur,

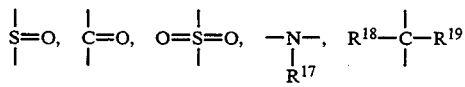

$R^{17}$ can be aryl (e.g., 6 to 20 carbon atoms) or acyl (e.g., 2 to 20 carbon atoms), $R^{18}$ and $R^{19}$ can be independently selected from hydrogen, alkyl groups of 1 to 4 carbon atoms, and alkenyl groups of 2 to 4 carbon atoms, $D^-$ cart be arty action, preferably a complex metal halide such as hexafluorophosphate, hexafluoroarsenate, hexafluoroantimonate, etc.

Examples of preferred diaryliodonium cations useful in the practice of the instant invention are diphenyliodonium, di(4-chlorophenyl)iodonium, 4-trifluoromethylphenylphenyliodonium, 4-ethylphenylphenyliodonium, di(4-acetylphenyl)iodonium, tolylphenyliodonium, anisylphenyliodonium, 4-butoxyphenylphenyliodonium, di(4-phenylphenyl)iodonium, di(carbomethoxyphenyl)iodonium, etc. Examples of other iodonium cations are disclosed in U.S. Pat. Nos. 3,729,313, 4,076,705, and 4,386,154.

Examples of substituted halomethyltriazines useful as photoinitiators in the practice of the instant invention are 2,4-bis(trichloromethyl)-6-methyl-s-triazine, 2,4,6-tris(trichloromethyl)-s-triazine, and styryl substituted triazines such as 2,4-bis(trichloromethyl)-6-(4'-methoxystyryl)-s-triazine, 2,4-bis(trichloromethyl)-6-(p-dimethylaminostyryl)-s-triazine, 2,4-bis(trichloromethyl)-6-(2',4'-diethoxystyryl)-striazine, etc. These compounds are described as noted above in U.S. Pat. Nos. 3,515,552, 3,536,489, 3,617,288, 3,640,718, 3,779,778, 4,386,154, 3,954,475, and 3,987,037.

Where the term "group" is used in describing substituents, substitution is anticipated which does not interfere with the polymerization reaction. For example, alkyl group includes ether groups (e.g., $CH_3-CH_2-CH_2-O-CH_2-$), haloalkyls, nitroalkyls, carboxyalkyls, hydroxyalkyls, sulfoalkyls, etc. wherein the term alkyl includes hydrocarbons of 1 to 20 carbon atoms. Substituents which react with active ingredients, such as very strong reducing or oxidizing substituents, would of course be excluded as not being sensitometrically inert or harmless.

Photopolymerization of the compositions of the instant invention occurs on exposure of the compositions to any source of radiation emitting actinic radiation at a wavelength within the ultraviolet and visible spectral regions. Electron beam can also be used. Suitable sources of radiation include, but are not limited to mercury, xenon, carbon arc and tungsten filament lamps, lasers, sunlight, etc. Exposures may be from less than about 1 microsecond to 10 minutes or more depending upon the amounts of particular polymerizable materials, the photoinitiator being utilized and depending upon the radiation source and distance from the source and thickness of the coating to be cured. The photoinitiator is used at a concentration of about 0.01 to 10 percent by weight of the solids content of the coated and dried photosensitive composition.

It is within the scope of the invention, when modification of polymer properties is desired, to include about 0.05 to 2.0 part of a copolymerizable ethylenically unsaturated monomer per pan of polymers of formula III by weight in the radiation sensitive compositions. Preferred monomers that can be used are the acrylic and methacrylic acid esters such as, for example, ethyl acrylate, butyl acrylate, n-octyl acrylate, allyl acrylate, cyclohexyl acrylate, N-methylcarbamoyloxyethyl acrylate, and multifunctional acrylates and methacrylates such as neopentylglycol diacrylate, 1,6-hexanediol diacrylate, pentaerythritol triacrylate and tetraacrylate, 1,3,5-tri(2-acryloyloxyethyl)isocyanurate, and the corresponding methacrylates.

A binder may optionally be present in practice of the instant invention. Any natural or synthetic aqueous solvent-soluble (or even nonaqueous solvent-soluble preferably in amounts up to about 20 percent by weight) polymeric binder may be used in the practice of this invention. Organic polymeric resins may be used. Thermoplastic resins are generally preferred. Examples of suitable binders are sulfonated polystyrene, polyvinyl alcohol, starch, polymethyl methacrylate, polyvinyl acetate, and the like. Beyond these minimal requirements, there is no criticality in the selection of a binder. In fact, even transparency or translucency are not required although they are desirable. A generally useful range is up to 30 percent by weight binder, preferably 2 to 15 percent of binder by weight.

The preferred utility of the photopolymerizable compositions of the present invention is as a presensitized plate for use in printing operations such as in the formation of lithographic plates. This structure comprises a grained and anodized aluminum substrate coated with from 0.3 to 9 g/m² of the compositions of the present invention. Grained substrates are surfaces which have been textured or roughened. This treatment is well known in the art and can be effected by brush graining (roughening with an abrasive material), chemical etching, or electrochemical graining. Anodizing is the well known anodic oxidation of metal surfaces.

Objects and advantages of this invention are further illustrated by the following examples, but the particular materials and amounts thereof recited in these examples, as well as other conditions and details, should not be construed to unduly limit this invention.

EXAMPLES

The materials employed below may be obtained from Aldrich Chemical Co. (Milwaukee, Wis.) unless otherwise specified. Materials were analyzed and their structures confirmed by one or more of the following techniques $^1$H NMR, infrared, and mass spectroscopy; gel phase chromatography; and differential scanning calorimetry.

The term MEK means methyl ethyl ketone.

The term "solid step" as used below refers to the highest numbered step on a $\sqrt{2}$ step wedge which is completely covered by material following development as judged by the unaided eye. The term "ghost step" refers to the highest numbered step which partly adheres to the plate after development as judged by the unaided eye. Higher solid steps at fixed exposure conditions correlate with higher photosensitivity (i.e., speed).

Example 1

This example describes the preparation of quaternary ammonium salts derived from 2-dimethylaminoethyl methacrylate (DMAEMA).

In a 250 mi round-bottom flask were combined 25.0 g (0.159 tool) DMAEMA and 60.0 g acetone. 0.159 mol of a primary alkyl or substituted primary alkyl halide was added and the mixture was stirred at 35 ° C. for 16 hr and was allowed to cool to room temperature. The alkyl(2-methacryloxyethyl)dimethylammonium halide which precipitated as a solid was filtered and recrystallized from ether/ethyl acetate (1:1).

Alkyl halides or alkaryl halides used in separate runs using this procedure were 1-bromodecane, 1-bromohexadecane, 1-bromooctadecane, 1-bromo-2-ethylhexane, 9-(chloromethyl)anthracene, and 1-(chloromethyl)-naphthalene which resulted in the preparation of (2-methacryloxyethyl)-1-decyldimethylammonium bromide, (2-methacryloxyethyl)-1-hexadecyldimethylammonium bromide (DMAEMAC-$C_{16}$), (2-methacryloxyethyl)dimethyl- 1-octadecylammonium bromide, 2-(methacryloxyethyl)-( 1-(2-ethylhexyl))dimethyl ammonium bromide, 2-(methacryloxyethyl)-(9-anthrylmethyl)dimethylammonium chloride, (2-methacryloxyethyl)-(2-naphthylmethyl)dimethylammonium chloride, respectively.

Example 2

This example describes the preparation of copolymers of 4,4-dimethyl-2-vinyl-2-oxazolin-5-one (VDM) and DMAEMA-$C_{16}$.

In a 1 L (32 oz) amber bottle were placed 95.0 g of VDM, 5.0 g DMAEMA-$C_{16}$ (Example 1), 2.0 g Vazo-64 TM therma/free-radical initiator (DuPont Co., Wilmington, Del.), and 200 g MEK. The mixture was purged with nitrogen for 10 min and the bottle was sealed. The bottle was heated to 65° C. for 10 hr to give a quantitative conversion of the monomers to a copolymer of VDM/DMAEMA-$C_{16}$ (95:5 wt %) having a no average wt. of 55,300 as confirmed by spectral analysis.

Example 3

Synthesis of aspattic acid mono-tetrabutylammonium salt (ASATBA):

In a 250 ml flask were placed aspattic acid (13.8 g), tetrabutylammonium hydroxide (67.5 g, 40 wt.% in water) and water (18.7 g). All of the aspattic acid dissolved after stirring at 50° C. for 15 minutes. Water was removed by using rotary evaporation in vacuum at 50° C. A waxy viscous mono salt of aspattic acid was obtained.

Examples 4–15

This example describes functionalization of the VDM/DMAEMA-$C_{16}$ (95:5 wt %) copolymer prepared in Example 2 with 2-hydroxyethyl methacrylate, ASATBA and $H_2O$.

The VDM/DMAEMA-$C_{16}$ (95:5 wt %) copolymer prepared in Example 2 (55.8 g as a 33% solution in MEK) was placed in a 250 ml three-necked flask equipped with a magnetic stirrer and a thermometer. To the solution were added 11.56 g 2-hydroxyethyl methacrylate (HEMA, 70 equivalent % relative to VDM), 100 mg 3,5-di-t-butyl-4-hydroxytoluene (BHT, thermal stabilizer), 0.7 g 1,8-diazabicyclo[5.4.0]undec-7-ene (DBU, base catalyst), and 23.1 g MEK. The solution was heated to 50°–55° C. for about 4 hr. The solution was allowed to cool to room temperature and 4.7 g aspattic acid mono-tetrabutylammonium salt (ASATBA, prepared in Example 3, 10 equivalent % relative to VDM dissolved in 9.4 g MEK) was added. The solution was stirred at room temperature for about 4 hr to yield a polymer having the composition: VDM (95%)/DMAEMA-$C_{16}$ (5%) wherein the VDM fraction was functionalized with HEMA (70%)/ASATBA (10%) thereby leaving 20% of the VDM units unreacted. The unreacted VDM groups were hydrolyzed by water and DBU for 3 hr at 50° C. A molecular weight ($\overline{M}_n$) of 92,300 was confumed by spectroscopic analysis.. According to this procedure additional polymers (Examples 5–15) were prepared as shown in Table 1. The random copolymer of Example 4 had the following structural formula:

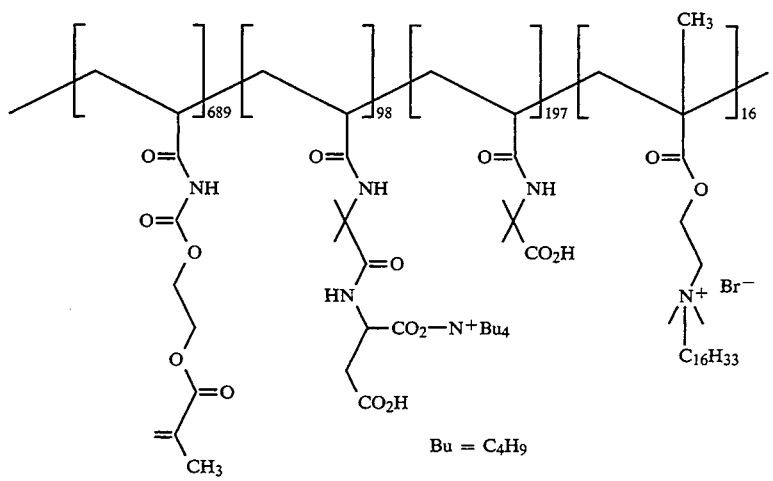

TABLE 1

| Example | Polymer Type (wt % of monomers) | Functionalization (equivalent % to VDM) | | | | | |
|---|---|---|---|---|---|---|---|
| | | HEMA | ASATBA | LA | TA | CS | $H_2O$ |
| 4 | VDM (95%)/ DMAEMA-$C_{16}$ (5%) | 70 | 10 | 0 | 0 | 0 | 20 |
| 5 | VDM (90%)/ DMAEMA-$C_{16}$ (10%) | 70 | 10 | 0 | 0 | 0 | 20 |
| 6 | VDM (90%)/ DMAEMA-$C_{16}$ (10%) | 70 | 0 | 0 | 30 | 0 | 0 |
| 7 | VDM (100%) | 70 | 10 | 0 | 0 | 10 | 10 |
| 8 | VDM (85%)/ DMAEMA-$C_{16}$ (5%)/ DMAEMA (10%) | 70 | 10 | 0 | 0 | 0 | 20 |
| 9 | VDM (75%)/ DMAEMA (25%) | 70 | 0 | 0 | 20 | 0 | 10 |
| 10 | VDM (95%)/ DMAEMA-$C_{16}$ (5%) | 85 | 10 | 0 | 0 | 0 | 5 |
| 11 | VDM (95%)/ DMAEMA-$C_{16}$ (5%) | 80 | 0 | 20 | 0 | 0 | 0 |
| 12 | VDM (95%)/ DMAEMA (5%) | 80 | 0 | 20 | 0 | 0 | 0 |
| 13 | VDM (75%)/ DMAEMA-$C_{16}$ (5%)/ BA (20%) | 70 | 0 | 30 | 0 | 0 | 0 |
| 14 | VDM (80%)/ EOA (20%) | 70 | 10 | 0 | 0 | 0 | 20 |
| 15 | VDM (80%)/ DMAEMA-$C_{16}$ (5%)/ EOA (15%) | 70 | 0 | 20 | 0 | 0 | 10 | wherein EOA = ethylene oxide acrylate ($\overline{M}_n$ = 750); BA = butyl acrylate; DMAEMA = dimethylaminoethyl methacrylate; LA = lactic acid; TA = tropic acid; CS = choline salicylate.

The data of Table 1 show compositions of polymers made by following the procedure as described in Examples 2 and 4.

Examples 16–26

These examples describe the utility of the polymers prepared above in printing plate applications. Coating solutions of the polymers prepared in Examples 4–15 were prepared by mixing: 0.3 g pentaerythritol tetraacrylate (8R-295 TM, Sartomer Co., Westchester, Pa.) as a 50 wt % solution in n-propanol/water azeotrope (72/28), 1.0 g of the polymer to be evaluated as a 33 wt % solution in MEK, 3.0 g n-propanol/water azeotrope (72/28), 0.025 g diphenyliodonium hexaflutrophosphate (prepared according to the procedure of U.S. Pat. No. 4,026,705 (May 31, 1977; Crivello)), and 0.001 g of compounds having structures 1, 2, or 3 below as sensitizer (see Brieskorn, C. H.; Otteneder, H. *Chem. Ber.* 1970, 103(2), 363–8 and Olomucld, M.; LeGall, J. Y. *Bull. Soc. Chim. Fr.* 1976, 9–10, pt.2, 1467–8 for preparations of compounds 1 and 2, respectively) (compound 3, Michler's Ketone, Aldrich Chem. Co.).

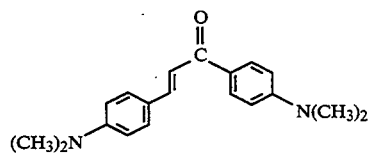

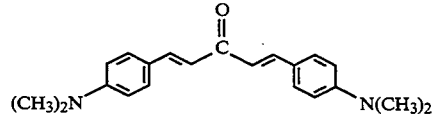

-continued

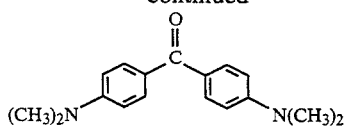

3

Closed vials containing solutions of the polymers prepared as above were wrapped in aluminum foil to exclude light, shaken for 30 rain, then coated using a #22 wire wound rod (R&D Specialties, Webster, N.Y.) onto, in separate runs: i) mechanically grained, anodized, and silicated aluminum sheeting (purchased from Anocoil, Rockville, Conn.) designated substrate B; and ii) ammonium bifluoride treated, anodized, and silicated aluminum sheeting (described in Wernick, S.; Pinner, R.; Sheashy, P. H. *The surface Treatment and Finishing of Aluminum and its Alloys*, 5th ed.:ASM International; Metal Park, OH, 1987; pp 178–81) designated substrate A. The coatings were dried by blowing hot air from a heat gun (dry coating wt. of 1.20–1.40 g/m²), then a topcoat consisting of 5 wt % aqueous solution of polyvinyl alcohol (Gelvatol ™ 20/30, Monsanto Chemical Co., St. Louis, Mo.) and 0.05 wt % Triton ™ X-100 surfactant (Rohm and Haas, Philadelphia, Pa.) in water, was applied using a #16 wire wound rod and dried as above. Strips of the coated construction were exposed through a $\sqrt{2}\overline{21}$ step sensitivity guide (Stouffer Graphic Aris Equipment Co., South Bend, In.) or through a Plate Control Wedge (Ugra, St. Gall, Switzerland) in a 2 kW Berkey Ascor ™ vacuum frame exposure unit (Berkey Technical Co., Woodside, N.Y.) equipped with a 2 kW Ascor Addalux Lamp No. 1406-01, or in a 3M brand model 70 (M-70) exposure unit (a 16,000 foot candle tungsten source described in U.S. Pat. No. 4,228,232, column 18, line 4). The exposed plates were then developed by mild rubbing with a cotton pad while submersed in 0.1 N aqueous sodium bicarbonate (pH 8.4). The number of solid steps and the time of exposures are shown in Table 2, below.

TABLE 2

| Example | Polymer Type | Substrate | Sensitizer | Exposure Unit | Time (sec) | Steps (solid) |
|---|---|---|---|---|---|---|
| 16 | Example 4 | A | 1 | Berkey | 5 | 8 |
|  |  | B | 1 | M-70 | 2 | 7 |
|  |  | B | 1 | Berkey | 5 | 9 |
|  |  | A | 3 | Berkey | 5 | 6 |
|  |  | B | 3 | Berkey | 5 | 9 |
| 17 | Example 5 | A | 1 | Berkey | 5 | 7 |
|  |  | B | 1 | Berkey | 5 | 10 |
| 18 | Example 6 | A | 1 | Berkey | 5 | 9 |
|  |  | B | 1 | Berkey | 5 | 10 |
| 19 | Example 7 | A | 1 | Berkey | 5 | 10 |
| 20 | Example 8 | A | 2 | Berkey | 10 | 4 |
|  |  | B | 2 | Berkey | 10 | 8 |
|  |  | A | 3 | Berkey | 5 | 6 |
|  |  | B | 3 | Berkey | 5 | 9 |
| 21 | Example 9 | A | 1 | Berkey | 5 | 12 |
|  |  | B | 1 | Berkey | 5 | 12 |
|  |  | B | 2 | M-70 | 2 | 9 |
| 22 | Example 10 | B | 2 | M-70 | 2 | ND |
| 23 | Example 11 | B | 2 | M-70 | 2 | ND |
| 24 | Example 13 | B | 2 | M-70 | 2 | 5 |
| 25 | Example 14 | A | 1 | Berkey | 5 | 2 |
|  |  | B | 1 | Berkey | 5 | 7 |
| 26 | Example 15 | A | 1 | Berkey | 5 | 3 |
|  |  | B | 1 | Berkey | 5 | 7 |

ND = non-developable; A = ammonium bifluoride grained and silicated aluminum base; B = mechanically grained, silicated aluminum (from Anocoil); Berkey = Berkey Ascor exposure unit; M-70 = 3M model 70 exposure unit.

The data of Table 2 show the utility of the polymers in printing plate applications having high speed and plates being developed at mild pH.

Example 27

This example demonstrates that the energy sensitive compositions of the instant invention may be employed without an oxygen barrier topcoat. A solution was prepared from the following components: 1.05 g pentaerythritol tetraacrylate, 7.0 g of a 33% solution of the polymer of Example 5 (VDM (95%)/DMAEMA-$C_{16}$ (5%), functionalized with 70 equivalent % HEMA, 10 equivalent % ASATBA, with remaining azlactone hydrolyzed to the corresponding carboxylic acid) in MEK, 21.0 g n-propanol, 14.0 g MEK, 0.105 g s-triazine 2 (see U.S. Pat. No. 4,476,215, column 6, line 2), 0.042 g Michler's ketone, 0,142 g diphenyliodonium hexafluorophosphate.

This solution was coated using a #15 wire wound rod (coating weight of 1.83 g/m²) onto two brush grained, anodized and silicated aluminum substrates, dried at 65° C. for 2 min, then exposed through a test negative for 7.5 sec in a Berkey Ascor 5 kW vacuum exposure unit. The exposed image was developed with a solution of pH 8.5 consisting of: 98.7% water, 0.8% sodium bicarbonate, and 0.5% Pelex ™ NBL sodium alkylnaphthalenesulfonate suffactant (KAO, Tokyo, Japan).

One of the plates was post-exposed using a 3M model 1332 post exposure unit (2 kW medium pressure Hg vapor lamp, 20 watt/cm output at a speed of 91 cm/min to further harden the photopolymer image. Press tests were then performed with both the post-exposed plate (Plate A) and the nonpost-exposed plate (Plate B). Plate B gave an actual 150,000 clear copies under these conditions, while Plate A showed no detectable wear after 150,0000 copies. This data show that the superior aqueous developable printing plates of the present invention are capable of long run performance.

Example 28–38

These examples further demonstrate that the energy sensitive compositions of the instant invention may be employed without an oxygen barrier topcoat and still give high speed. Solutions were prepared from the following components: 0.48 g pentaerythritol tetraacrylate (50% in MEK), 2.2 g of a 33% solution of polymer in MEK (Table 3, polymers made following procedure of Examples 1–4), 6.0 g MEK, 0.06 g s-triazine 2, i.e., (2-(p-2-hydroxyethoxystyryl)-4,6-bis(trichloromethyl)-1,3,5-triazine, 0.70 g of a solution of 17.5% pigment dispersion in MEK composed of 5:1 Sunfast Blue (Sun Chemical, Fort Lee, N.J.)/VYNS-3 ™ vinyl acetate/vinylchloride copolymer with some acid groups present (Union Carbide, Tarrytown, Pa.).

The solutions were coated using a #9 wire wound rod onto substram A of Table 2 and dried at 65° C. for 2 min. having coating wt. of 1.20–1.40 g/m². The plate was exposed through a 21 step neutral density $\sqrt{2}$ step wedge for 7.5 sec in a 5 kW Berkey Ascor exposure unit and developed using a 0.1 N NaHCO₃ developer. The number of steps, after exposure and development, arc shown in Table 3.

TABLE 3

| Ex. | Polymer Type (wt % monomers) | Functionalization (equivalent % to VDM) | | | | Steps[a] |
|---|---|---|---|---|---|---|
| | | % HEMA | % ASATBA | % $H_2O$ | % $PhCH_2NH_2$ | |
| 28 | VDM (95%)/ DMAEMA-$C_{16}$ (5%) | 70 | 10 | 20 | 0 | 5/8 |
| 29 | VDM (100%) | 70 | 10 | 20 | 0 | 4/7 |
| 30 | VDM (80%)/ DMAEMA-$C_{16}$ (20%) | 70 | 10 | 20 | 0 | 6/8 |
| 31 | VDM (100%) | 80 | 20 | 0 | 0 | 4/7 |
| 32 | VDM (95%)/ DMAEMA-$C_{16}$ (5%) | 73.7 | 13.1 | 0 | 13.2 | 7/10 |
| 33 | VDM (80%)/ DMAEMA-$C_{16}$ (20%) | 73.7 | 13.1 | 0 | 13.2 | 7/11 |
| 34 | VDM (100%) | 70 | 0 | 30 | 0 | 4/7 |
| 35 | VDM (100%) | 70 | 20 | 0 | 10 | 3/6 |
| 36 | VDM (100%) | 70 | 15 | 0 | 15 | 4/7 |
| 37 | VDM (100%) | 60 | 20 | 0 | 20 | 3/5 |
| 38 | VDM (80%)/ Benzyl acrylate (20%) | 60 | 10 | 30 | 0 | 5/9 |

[a] = steps (solid/ghost)

Examples 39–41 illustrate the incorporation of alkali metal carboxylates into free radically crosslinkable polymers with the retention of organic solvent solubility to afford aqueous processable systems.

Example 39

This example describes the preparation of a solution of poly(VDM)/(70% HEMA: 30% water) in MEK.

Poly(VDM) was prepared as follows: a solution containing vinyldimethylazlactone (10.2 kg, SNPE, Princeton, N.J.), 23.8 kg MEK, and 51 g azobis(isobutyronitrile) was heated to 60° C. under nitrogen for 18 hr to yield a clear, colorless solution of poly(VDM) in MEK.

Concentrated HCl (0.21 g, 2.0 meq HCl) was added to a stirred solution containing poly(VDM) (26.65 g of a 31.3 wt % solution in MEK, 60 meq azlactone), 5.46 g (42 meq) HEMA (Alcolac, Baltimore, MID), 0.01 g BHT, and 13.89 g MEK causing an immediate exotherm which raised the temperature of the solution to 30° C. The solution was heated to 70° C. for 1.5 hr, then cooled to room temperature. Water (0.32 g, 18 meq) and 0.75 g MEK were added to the solution which was then heated to 70° C. for 2 hr, and allowed to cool, to provide a solution of the desired polymer.

Example 40

This example describes the preparation of a solution of poly(VDM)/(60% HEMA, 25% water, 15% sodium hydroxide) in MEK.

A solution of 15 wt % NaOH in methanol (1.60 g, 6.0 meq NaOH) was added dropwise to 29.89 g of a 30 wt % solution of poly(VDM)/(70% HEMA: 30% water) (16 meq carboxylic acid residues), prepared according to the previous example, thereby producing a homogeneous MEK solution. The resultant polymer was soluble in water.

Example 41

This example describes the preparation of a solution of poly(VDM)/(80% HEMA, 10% sodium hydroxide, 10% 1-hexadecanol) in MEK.

A solution containing 10.40 g (80 meq) HEMA, 0.23 g 12 M HCl (2.8 meq HCl, 10 meq water), and 3.00 g MEK was added to a stirred solution containing poly(VDM) (44.41 g, 31.3 wt % in MEK, 100 meq azlactone residues), 0.03 g BHT, 2.42 g 1-hexadecanol and 29.26 g MEK. The solution was heated to 70° C. for 1 hr then cooled to room temperature.

A solution of 15 wt % NaOH in methanol (0.80 g, 3.0 meq NaOH) was added dropwise to a rapidly stirred solution containing the polymer prepared above (26.90 g, 3 meq carboxylic acid residues) and 107.9 g MEK resulting in a clear viscous solution containing the desired polymer.

Examples 42–49 demonstrate the utility of sulfonates having either organic or inorganic counter ions to prepare organic solutions of aqueous processable photocurable polymers. Examples 45–46 further demonstrate use of cationic dyes to function both as a sulfonate gegenion and as a coating colorant.

Example 42

This example describes the preparation of a solution of poly(VDM)/(50% HEMA, 33% water, 17% 3-hydroxypropanesulfonic acid) in MEK.

A solution containing 26.00 g (0.20 eq) HEMA, 2.08 g of an 80 wt % aqueous solution of 3-hydroxypropanesulfonic acid (HPSA) (Fluka Chemical Corp., Ronkonkoma, N.Y.; 12 meq HPSA, 23 meq water), and 45.00 g MEK was added in a stream to a rapidly stirred solution containing 177.64 g of a 31.3 wt % of poly(VDM) in MEK (0.40 eq azlactone), 0.06 g BHT, and 100.00 g MEK. The solution was heated to 65° C. for 2 hr, then cooled to room temperature and diluted with 106.93 g MEK. Additional aqueous HPSA (9.81 g, 56 meq HPSA, 109 meq water) was added with vigorous stirring. The solution was heated to 65° C. for 0.5 hr and cooled to room temperature to yield an extremely viscous solution containing the desired polymer.

Example 43

This example describes the preparation of a solution of poly(VDM)/88% HEMA, 8% sodium hydroxide, 4% sodium 3-hydroxypropanesulfonate) in MEK.

Methanolic NaOH (15 wt %, 1.29 g, 4.8 meq NaOH) was added to a rapidly stirred solution containing 35.00 g (4.8 meq combined acid residues) poly(VDM)/(88% HEMA, 8% sodium hydroxide, 4% 3-hydroxypropanesulfonie acid) in MEK prepared according to the procedure of Example 42 and 115 g MEK to produce an MEK soluble, water soluble polymer.

Example 44

This example describes the preparation of a solution of poly(VDM)/(50% HEMA, 33% tetrabutylammonium carboxylate, 17% tetrabutylammonium 3-hydroxypropanesulfonate) in MEK.

Tetrabutylammonium hydroxide (4.14 g 25% solution in methanol, 4.0 meq tetrabutylammonium) was added to 23.00. g of a 30 wt % stirred solution of poly(VDM)/(50% HEMA, 33% water, 17% 3-hydroxypropanesulfonic acid), prepared in Example 42, and 34.22 g MEK to yield a low viscosity solution containing the desired polymer.

Example 45

This example describes the preparation of a solution of poly(VDM)/(50% HEMA, 33% water, 13% Rhodamine B 3-hydroxypropanesulfonate, 4% tetrabutylammonium 3-hydroxypropylsulfonate) in MEK.

Rhodamine B Base (American Cyanamid Co., Wayne, N.J.; 4.24 g, 10 meq) and 1.18 g (3.3 meq) tetrabutylammonium acetate were dissolved in a solution containing the polymer of Example 42 (62.22 g at 30 wt % in MEK, 13.3 meq sulfonic acid residues), and 50.88 g MEK to produce a clear magenta solution containing the desired polymer.

Example 46

This example describes the preparation of a solution of poly(VDM)/(60% HEMA, 27% water, 17% Crystal Violet 3-hydroxypropanesulfonate) in MEK. Crystal Violet Base (BASF Corp., Parsippany, N.J.; 14.00 g, 36 mmol) was added to a solution containing of poly(VDM)/(60% HEMA, 27% water, 13% -hydroxypropanesulfonic acid) (116.7 g, 37 meq sulfonic acid residues, 30 wt % in MEK) prepared according to the procedure of Example 42, and 164.35 g MEK. An intensely violet viscous .solution, which contained the desired polymer, resulted.

Example 47

This example describes the preparation of a solution of poly(VDM)/(50% HEMA, 33% lithium carboxylate, 17% lithium 3-hydroxypropanesulfonate) in MEK. A 5 wt % ethanolic solution of lithium acetate dihydrate (4.68 g, 2.3 meq lithium acetate) was added to a solution of the polymer from Example 42 (10.73 g, 2.3 meq sulfonic acid residues) in a mixture of 48.30 g ethanol and 5.37 g MEK. A clear solution was produced which contained the desired polymer.

Example 48

This example describes the preparation of a solution of poly(VDM)/(30% HEMA, 6% water, 3% 3-hydroxypropanesulfonic acid, 61% 1-butanol) in MEK. A solution containing 80 wt % aqueous HPSA (0.53 g, 6 meq water, 3 meq H. PSA), 3.90 g (30 meq) HEMA, and 3.0 g MEK was added to a rapidly stirred solution containing poly(VDM) (31.3% in MEK, 44.41 g: 100 meq azlactone residues), 4.51 g (61 meq) 1-butanol, 9 mg BHT, and 19.78 g MEK. The solution was heated to 70° C. for 1 hr, then cooled to room temperature. The solution contained the desired polymer.

Example 49

This example describes the preparation of a solution of poly(VDM)/(30% HEMA, 6% sodium hydroxide, 3% sodium 3-hydroxypropanesulfonate, 61% 1-butanol) in MEK.

Methanolic NaOH (15 wt %, 1.60 g, 6 meq) was added to the polymer prepared in the preceding example (50 g of 30 wt % in MEK, 6 meq combined acid residues) and 100 g MEK. The resulting solution contained the desired polymer.

Various modifications and alterations of this invention will become apparent to those skilled in the an without departing from the scope and spirit of this invention, and it should be understood that this invention is not to be unduly limited to the illustrative embodiments set forth herein.

We claim:

1. A composite structure comprising a composition coated on a grained, anodized, and hydrophilized aluminum, wherein the composition comprises an effective amount of a thermal or photoinitiator and a polymer having the formula;

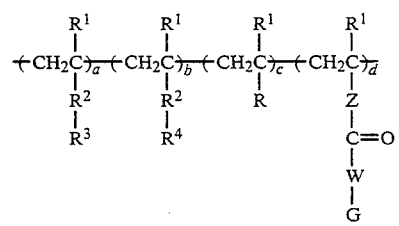

wherein $R^1$ is independently hydrogen or methyl;

$R^2$ is given by

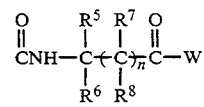

wherein n is 0 or 1;

$R^5$, $R^6$, $R^7$, and $R^8$ are independently an alkyl group having 1 to 12 carbon atoms or a cycloalkyl group having 5 to 12 carbon atoms, an aryl or aralkyl group having 6 to 12 carbon atoms or at least one of the pairs $R^5$ and $R^6$, and $R^7$ and $R^8$, taken together with the carbon to which it is joined forms a 5- or 6-membered carbocyclic ring, or any of $R^5$, $R^6$, $R^7$, and $R^8$ may be H when n is 1;

W is —NH—, —NR$^{20}$, —S— or —O—; wherein $R^{20}$ is alkyl of 1 to 12 carbon atoms; and Z represents

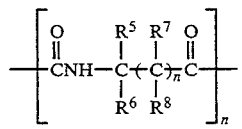

wherein $R^5$, $R^6$, $R^7$, $R^8$, and n are as previously described;

$R^3$ is a polymerizable, ethylenically unsaturated group selected from (a)

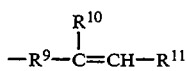

in which

R$^9$ is an alkylene group having 1 to 12 carbon atoms, an arylene group having 6 to 10 carbon atoms, an oxyalkylene group or a poly(oxyalkylene) in which said alkylene group has 2 to 4 carbon atoms, the number of oxygen atoms is a positive integer less than or equal to four; R$^{10}$ is hydrogen, cyano, a carboxyl group, or a —C(=O)NH$_2$ group; and R$^{11}$ is hydrogen, an alkyl group having 1 to 12 carbon atoms, or a phenyl group or naphthyl group; or (b) —R$^9$—W-T in which R$^9$ is as defined as in (a), W is as previously defined, and T is an ethylenically unsaturated group selected from the group consisting of acryloyl, methacryloyl, cinnamoyl, maleoyl, fumaroyl, itaconoyl, and crotonoyl, and is preferably acryloyl or methacryloyl;

a, b, c, and d are independently integers, wherein a and b are at least 1, and the sum of a+b+c+d is sufficient to provide a polymer having a number average molecular weight in the range of 2,000 to 1,000,000;

G is given by —R$^9$—N+R$^{12}$R$^{13}$R$^{14}$X—], wherein R$^9$ is as previously defined, and R$^{12}$-R$^{14}$ are independently an alkyl group having 1 to 12 carbon atoms or a cycloalkyl group having 5 to 12 carbon atoms, an aryl or aralkyl group having 6 to 12 carbon atoms or any two or all three of R$^{12}$-R$^{14}$ taken together with the nitrogen to which they are joined can form a 5- to 8-membered heterocyclic ring, and X' represents any non-interfering anion including anions located elsewhere on the polymeric backbone or side chains;

R represents an aryl group having from 6 to 30 carbon atoms, cyano, —CO$_2$H, carboalkoxy group having from 2 to 40 carbon atoms, or a mono- or dialkylamido group having from 2 to 40 carbon atoms;

R$^4$ represents, a solubilizing cation, or —E—A wherein E represents an organic divalent connecting group having up to a total of about 18 C, N, S, and nonperoxidic 0 atoms, and A is an acid selected from carboxylic acids, sulfonic acids, phosphonic acids, and salts thereof.

2. The composite structure according to claim 1 wherein said hydrophilized aluminum is silicated aluminum.

3. The composite structure according to claim 1 which is a printing plate.

4. The composite structure according to claim 1 further comprising a topcoat oxygen barrier.

* * * * *

UNITED STATES PATENT AND TRADEMARK OFFICE
CERTIFICATE OF CORRECTION

PATENT NO.: 5,437,932
DATED: August 1, 1995
INVENTOR(S): Ali et al.

It is certified that error appears in the above-identified patent and that said Letters Patent is hereby corrected as shown below:

[57] Abstract, line 3, delete "hydroearbyl" and insert --hydrocarbyl--

Col. 3, line 52, Delete "$R^{2}$" and insert --$R^{20}$--

Col. 4, line 8, Delete "(oxyalkylone)" and insert --(oxyalkylene)--

Col. 7, line 35, Insert --wherein--

Col. 7, line 40, Delete "arty action" and insert --any anion--

Col. 8, line 27, Delete "pan" and insert --part--

Col. 9, line 34, Delete "mi" and insert --ml--

Col. 9, line 35, Delete "tool" and insert --mol--

Col. 9, line 54, Delete (D MAEMAC-$C_{16}$)" and insert --(DMAEMA-$C_{16}$)--

Col. 10, line 4, Delete "therma/" and insert --thermal--

Col. 10, line 12, Insert --m.-- before "wt."

Col. 10, lines 16, 19, 21, 25 and 50, delete "aspattic" and insert --aspartic--

Col. 11, line 58, Delete "8R" and insert --SR--

Col. 11, line 62, Delete "hexaflutrophosphate" and insert --hexafluorophosphate--

Col. 11, line 67, Delete "Olomucld" and insert --Olomucki--

Col. 13, line 17, Delete "Sheashy" and insert --Sheasby--

Col. 13, line 28, Delete "$\sqrt{221}$" and insert --$\sqrt{2}\,21$--

Col. 13, line 29, Delete "Aris" and insert --Arts--

Col. 14, line 19, Delete "0,142" and insert --0.142--

Col. 14, line 29, Delete "suffactant" and insert --surfactant--

Col. 14, line 61, Delete "substram" and insert --substrate--

Col. 14, line 67, Delete "arc" and insert --are--

Col. 15, line 39, Delete "MID" and insert --MD--

UNITED STATES PATENT AND TRADEMARK OFFICE
CERTIFICATE OF CORRECTION

PATENT NO.: 5,437,932
DATED: August 1, 1995
INVENTOR(S): Ali et al.

It is certified that error appears in the above-identified patent and that said Letters Patent is hereby corrected as shown below:

Col. 16, line 67 & 68, Delete "3-hydroxy-propanesulfonie" and insert --3-hydroxy-propanesulfonic--

Col. 17, line 37, Delete "-hydroxy" and insert --3-hydroxy--

Col. 17, line 41, Delete ".solution" and insert --solution--

Col. 17, line 49, Start new paragraph with "A 5 wt %..."

Col. 17, line 62, Delte "H. PSA" and insert --HPSA--

Col. 17, line 64, Delete "g:" and insert --g,--

Col. 18, line 13, Delete "an" and insert --art--

Col. 20, line 6, Delete "X'" and insert --X--

Col. 20, line 18, Delete "0" and insert --O--

Signed and Sealed this

Twelfth Day of March, 1996

Attest:

Attesting Officer

BRUCE LEHMAN

Commissioner of Patents and Trademarks